US012560955B2

(12) United States Patent
Aihara et al.

(10) Patent No.: US 12,560,955 B2
(45) Date of Patent: Feb. 24, 2026

(54) SEMICONDUCTOR DEVICE AND SEMICONDUCTOR SYSTEM

(71) Applicant: RENESAS ELECTRONICS CORPORATION, Tokyo (JP)

(72) Inventors: Yusuke Aihara, Tokyo (JP); Kuniyasu Tajima, Tokyo (JP); Naoyuki Hamanishi, Tokyo (JP); Tadashi Kameyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 898 days.

(21) Appl. No.: 17/748,770

(22) Filed: May 19, 2022

(65) Prior Publication Data

US 2023/0376058 A1 Nov. 23, 2023

(51) Int. Cl.
| | |
|---|---|
| *G06F 13/42* | (2006.01) |
| *G05F 1/46* | (2006.01) |
| *H01L 23/66* | (2006.01) |
| *H01P 3/08* | (2006.01) |
| *H05K 1/02* | (2006.01) |

(52) U.S. Cl.
CPC .............. *G05F 1/46* (2013.01); *H01L 23/66* (2013.01); *H01P 3/081* (2013.01); *H05K 1/0243* (2013.01); *H05K 1/0245* (2013.01); *H05K 1/025* (2013.01); *H01L 2223/6627* (2013.01); *H01L 2223/6638* (2013.01)

(58) Field of Classification Search
None
See application file for complete search history.

(56) References Cited

U.S. PATENT DOCUMENTS

| | | | | |
|---|---|---|---|---|
| 2004/0070409 A1* | 4/2004 | Mobley | ................. | H04L 25/063 |
| | | | | 324/672 |
| 2012/0154110 A1* | 6/2012 | Kim | ....................... | G06F 3/0436 |
| | | | | 345/177 |
| 2012/0176156 A1* | 7/2012 | Chang | ................. | H04L 25/0278 |
| | | | | 326/62 |
| 2012/0280766 A1* | 11/2012 | Regnier | ............... | H05K 3/3447 |
| | | | | 174/262 |
| 2021/0151084 A1* | 5/2021 | Kim | ....................... | G11C 7/222 |

FOREIGN PATENT DOCUMENTS

JP 2012-079786 A 4/2012

* cited by examiner

*Primary Examiner* — Henry Tsai
*Assistant Examiner* — Dean Phan
(74) *Attorney, Agent, or Firm* — Rimon P.C.

(57) ABSTRACT

A semiconductor device includes a receiving terminal for receiving a signal transmitted through a signal transmission line, a reference plane voltage terminal connected to a refence plane as a refence for the signal on the signal transmission line and a voltage generating circuit configured to generate a refence plane voltage to be supplied to the reference plane voltage terminal based on the signal received by the receiving terminal.

17 Claims, 10 Drawing Sheets

SEMICONDUCTOR DEVICE AND SEMICONDUCTOR SYSTEM

BACKGROUND

The present invention relates to a semiconductor system, for example, can be suitably used in a semiconductor system for mounting a semiconductor device comprising a circuit for transmitting signals at high speed.

In order to transmit large volumes of data at high speed, transmission rate in various interface standards is increased. For example, transmission rate of standards such as PCI-e (Peripheral Component Interconnect-Express, DDR (Double Data Rate), USB (Universal Serial Bus), CSI (Camera Serial Interface), DSI (Display Serial Interface) have been accelerated. The semiconductor devices equipped with high-speed interfaces corresponding to these standards are used in various equipment such as automobile, mobile equipment, medical equipment, and manufacturing equipment. The semiconductor devices with such high-speed interfaces are mounted on a printed circuit board and connected to another semiconductor device, component, or connectors for connection with external device.

For the speedup of data transmission, it is important to prevent the disturbance of signal waveform. Therefore, impedance control including the signal transmission line on the printed circuit board is required.

For example, Japanese Unexamined Patent Application Publication No. 2012-79786 (Patent Document 1) discloses a technique of determining a frequency which is a main cause of deterioration of a signal waveform, and determining a shape of a signal transmission line so as to match an impedance with the frequency.

SUMMARY

Generally, the characteristic impedance of a signal transmission line on a printed circuit board is determined by the shape of the wiring, the surrounding material, and the dielectric constant of the material between the wiring and the reference plane. Therefore, the characteristic impedance of the signal transmission line is affected by the manufacturing error of the signal transmission line. Further, the wiring pattern on the printed circuit board have different manufacturing errors for each printed circuit board, since it is difficult to change its shape every time of manufacture. Therefore, the characteristic impedance changes based on the manufacturing errors. As a result, the characteristics of the transmitted signal are affected.

The semiconductor devices that transmit and receive high-speed signals may include encoding circuit, pre-emphasis circuit, equalizers, and the like to maintain signal quality. Therefore, the manufacturing errors of the signal transmission lines on the printed circuit board can be compensated by such circuits. However, as the signal transmission speed increases, it may become difficult to ensure sufficient signal quality even by using such circuits.

Other objects and novel features will become apparent from the description of this specification and the accompanying drawings.

A semiconductor device according to one embodiment includes a receiving terminal for receiving a signal transmitted through a signal transmission line, a reference plane voltage terminal connected to a reference plane which is a reference for the signal on the signal transmission line and a voltage generating circuit configured to generate a reference plane voltage for the reference plane based on the signal received by the receiving terminal.

A semiconductor system according to another embodiment includes a semiconductor device having a receiving terminal for receiving a signal transmitted through a signal transmission line, a reference plane voltage terminal connected to a reference plane which is a reference for the signal on the signal transmission line and a voltage generating circuit configured to generate a reference plane voltage for the reference plane based on the signal received by the receiving terminal, a printed circuit board on which the semiconductor device in mounted. The printed circuit board includes a first conductor layer having the signal transmission line and a second conductor layer having a reference plane.

According to the one embodiment, even after mounting the semiconductor device on a printed circuit board, it is possible to adjust the characteristic impedance of the signal transmission line.

BRIEF DESCRIPTION OF THE DRAWINGS

FIG. 3 is a block diagram showing a configuration example of the semiconductor device according to the first embodiment.

FIG. 4 is a block diagram of a voltage generating circuit according to the first embodiment.

FIG. 8 is a block diagram showing a configuration of a semiconductor device according to the second modified example of the first embodiment.

DETAILED DESCRIPTION

Figure 1:
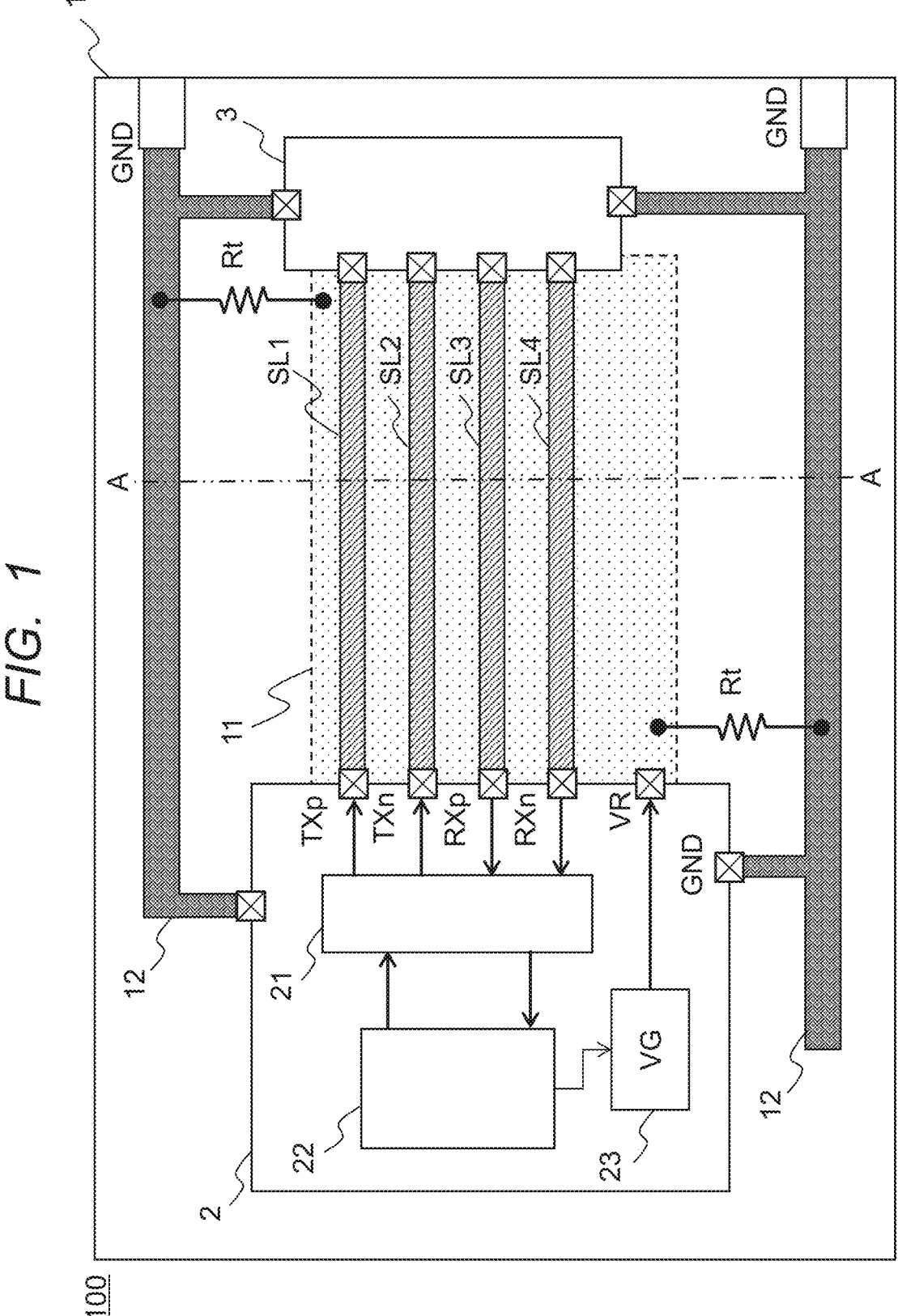
FIG. 1 is a block diagram showing a configuration of a semiconductor system according to the first embodiment.

Hereinafter, a semiconductor system according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the so embodiments may be arbitrarily combined with each other.

First Embodiment

FIG. 1 is a block diagram showing a configuration of a semiconductor system according to the present embodiment.

The semiconductor system 100 shown in FIG. 1 includes a printed circuit board 1, and semiconductor devices 2, 3 mounted on the printed circuit board 1. The semiconductor devices 3 are electrically connected to each other via signal transmission lines SL1-SL4 formed on the printed circuit board 1. The signal transmission lines SL1, SL2 transmit signals that the semiconductor device 2 transmits toward the semiconductor device 3, and the signal transmission lines SL3, SL4 transmit signals to be received by the semiconductor device 2 from the semiconductor device 3.

Each of the semiconductor devices 2, 3 is, for example, a SoC (System on Chip) composed of one semiconductor chip. The semiconductor devices 2, 3 include, for example, SERDES circuits (SERializer/DESerializer) (not shown) for mutually converting serial and parallel transmissions, and mutually transmit signals in accordance with a high-speed serial transmission standard such as PCI-e, for example. In the examples shown in FIG. 1, a configuration of a semiconductor system that performs communication by using a serial communication system with differential signals, such as a PCI-e, is shown. The signal transmission lines SL1, SL2 constitute a differential signal transmission line pair for transmitting a differential signal from the semiconductor device 2, the signal transmission lines SL3, SL4 constitute a differential signal transmission line pair for transmitting the received signal of the semiconductor device 2.

The printed circuit board 1 has the signal transmission lines SL1-SL4, a reference plane 11, and a ground potential line 12. The printed circuit board 1 is, for example, a multilayer printed wiring board having a plurality of conductor layers, also referred to as a printed wiring board, a board, or a mounting substrate.

The signal transmission lines SL1-SL4 are transmission paths for transmitting signals between the semiconductor devices 2, 3 on the printed circuit board 1. The signal transmission lines SL1-SL4 transmit high-speed signals. The signal transmission lines SL1-SL4 are, for example, high-speed signal transmission lines for transmitting signals at 16 GTS (GigaTransfers per second) such as PCI-e Gen 4. When the signal transmission lines SL1-SL4 are collectively referred to, or when the signal transmission lines SL1-SL4 are not distinguished, the signal transmission lines SL1-SL4 are simply referred to as a signal transmission line SL.

The reference plane 11 is a conductor pattern to which a potential as a reference of the signal transmitted through the signal transmission line SL is applied, and an impedance forming surface of the signal transmitted through the signal transmission line SL. The reference plane 11 is disposed so as to overlap the area where the signal transmission line SL is formed in plan view. Since the signal transmission line SL propagates a high-speed signal, the reference plane 11 is preferably provided in a layer adjacent to the layer where the signal transmission line SL is formed. The reference plane 11 is also connected to the ground potential line 12 via a resistor Rt. The resistor Rt will be described later.

The ground potential line 12 is supplied with the ground potential. The semiconductor devices 2, 3 are supplied with the ground potential via the ground potential line 12.

Figure 2:
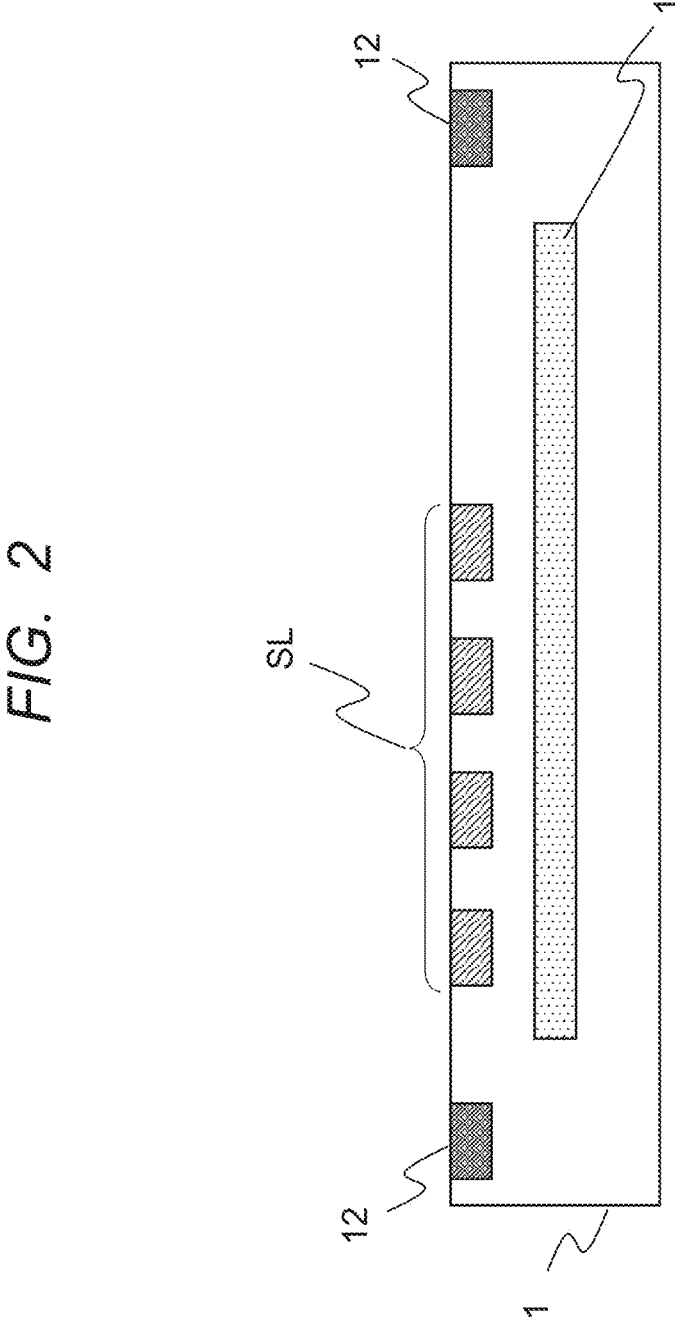
FIG. 2 is a schematic cross-sectional view taken along line A-A of FIG. 1.

FIG. 2 is a schematic cross-sectional view along line A-A of FIG. 1, Each signal transmission lines SL1-SL4 has microstrip line structure. That is, the signal transmission line SL1-SL4 are provided on the surface layer of the printed circuit board 1 and are connected to terminals of the semiconductor devices 2, 3 via a bonding material such as solder. The reference plane 11 is formed in a conductive layer below the layer in which the signal transmission line SL1-SL4 are formed. The ground potential line 12 is disposed on the surface layer in the same manner as the signal transmission lines SL1-SL4 in FIG. 2. However, the ground potential line 12 may be formed in the same layer as the layer in which the reference plane 11 is formed or may be formed in different layers.

Figure 3:
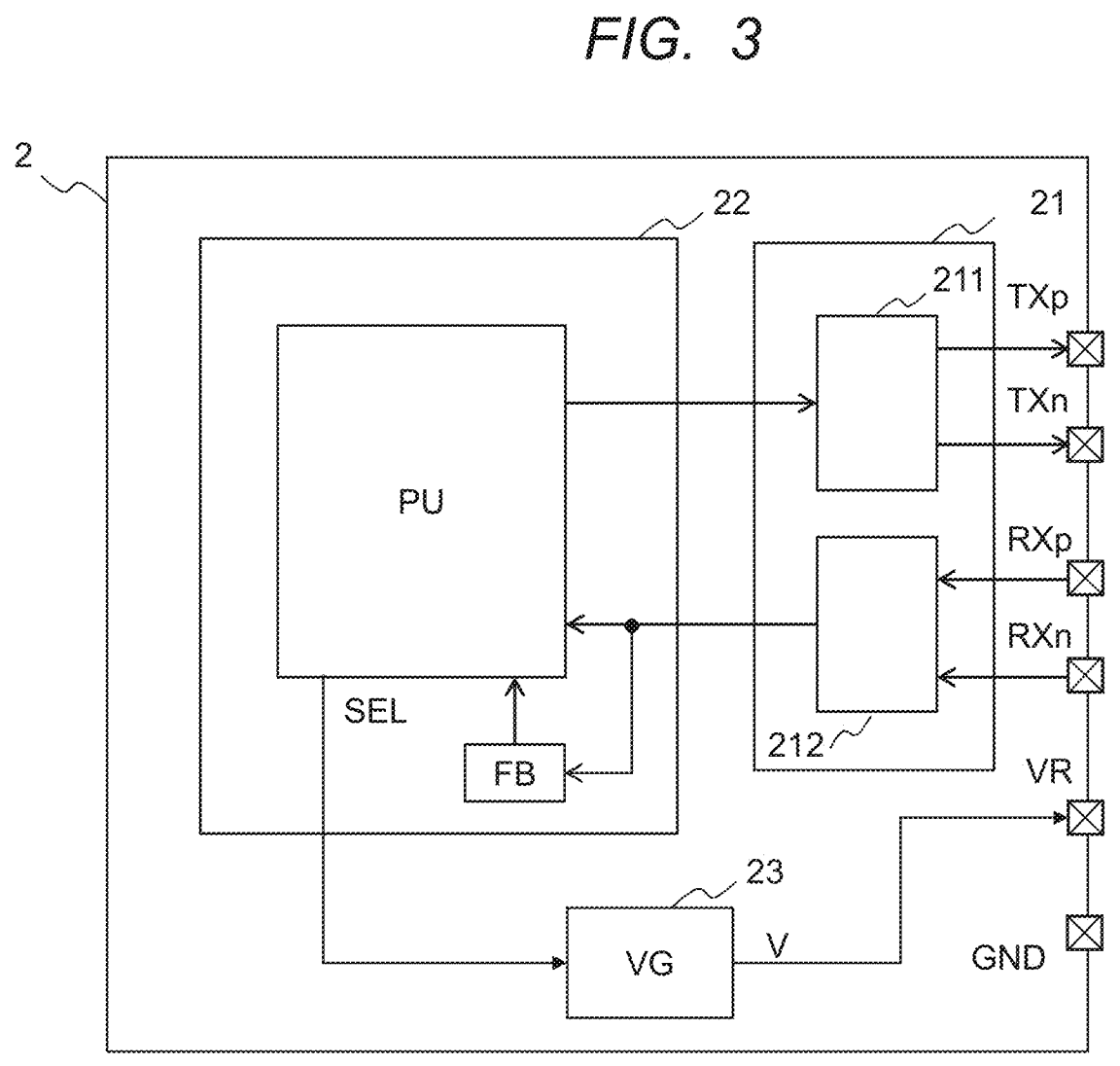

FIG. 3 is a block diagram showing a configuration example of the semiconductor device 2 in the first embodiment. The semiconductor device 2 has an interface circuit 21, a signal processing unit 22, a voltage generating circuit 23, transmission terminals TXp, TXn, receiving terminals RXp, RXn, a reference plane voltage terminal VR and ground terminal GND. The transmission terminals TXp, TXn are connected to the signal transmission lines SL1, SL2, respectively. The receiving terminals RXp, RXn are connected to the signal transmission lines SL3, SL4, respectively. The reference plane voltage terminal VR is connected to the reference plane 11 on the printed circuit board 1. The ground terminal GPD is connected to the ground potential line 12 on the printed circuit board 1.

The interface circuit 21, as shown in FIG. 3, includes a transmitting circuit 211 and the receiving circuit 212. The transmitting circuit 211 converts the signal received from the signal processing unit 22 into a signal according to a predetermined transmission protocol. Furthermore, the transmitting circuit 211 generates differential signals based on the converted signal, and outputs the differential signals from the transmission terminals TXp, TXn. The differential signals outputted from the transmission terminal TXp, TXn are transmitted to the component (semiconductor device 3) as the connection destination of the semiconductor device 2 via the signal transmission lines SL1, SL2. The receiving circuit 212 restores the signals (differential signals) received from the receiving terminals RXp, RXn in order that the signal processing unit 22 processes the signals. The signal processing unit 22 executes a predetermined process based on the restored signals.

The signal processing unit 22 includes a processing unit PU and the signal quality feedback circuit FB. The processing unit PU is, for example, a CPU (Central Processing Unit). The processing unit PU processes data in accordance with a program stored in a memory (not shown). The processing unit PU executes processing in accordance with a program to generate a signal (data) and sends the signal (data) to the interface circuit 21. Further, the processing unit PU executes processing based on the signal (data) received by the interface circuit 21.

The signal quality feedback circuit FB performs signal quality evaluation of the received signals transmitted through the signal transmission lines SL3, SL4. For example, the signal quality feedback circuit FB is a bit error rate counter that counts the bit error of the received signal. Thus, by measuring the bit error rate, the quality evaluation of signal transmitted through the signal transmission line SL is performed. The evaluation result by the signal quality feedback circuit FB is output to the processing unit PU. The processing unit PU, based on the evaluation result by the signal quality feedback circuit FB, generates a selection control signal SEL, and outputs to the voltage generating circuit 23.

Figure 4:
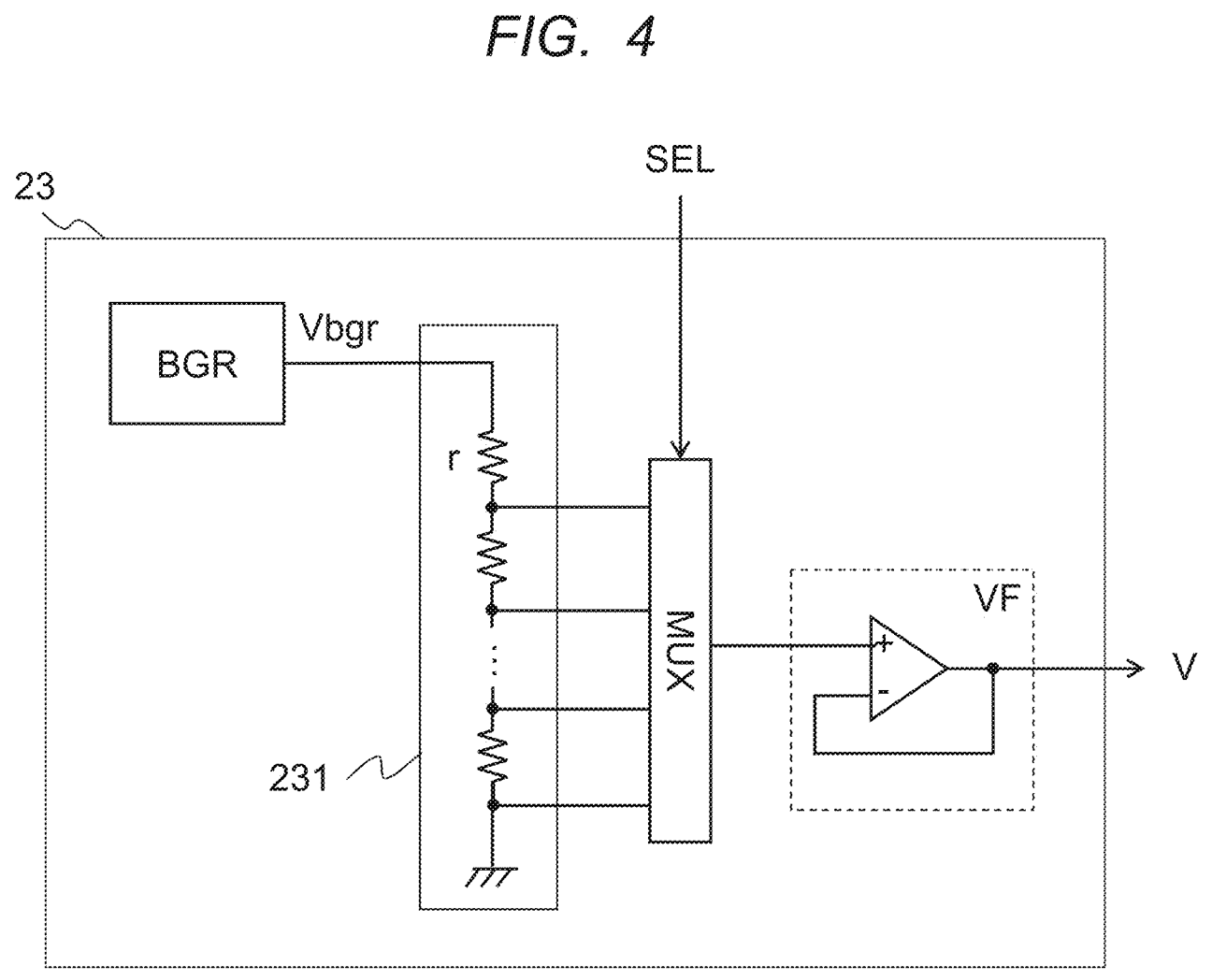

The voltage generating circuit 23 generates a reference plane voltage V to be applied to the reference plane. FIG. 4 shows a circuit configuration example of a voltage generating circuit 23. The voltage generating circuit 23 has a band gap reference circuit (reference voltage source) BGR, a resistor divider circuit 231, a selection circuit MUX and the voltage follower circuit VF, The resistor divider circuit 231 includes a plurality of resistor elements r connected in series, and divides between the output voltage Vbgr of the band gap reference circuit BGR and the ground potential by a plurality of resistor elements r, to generate a plurality of voltages. The selection circuit MUX selects any one of a plurality of voltages generated by the resistor divider circuit 231 based on the selection control signal SEL from the processing unit PU. The selected voltage is applied to the reference plane 11 from the reference plane voltage terminal VR via the voltage follower circuit VF as a reference plane voltage V. By using the voltage follower circuit VP, it is possible to supply a voltage at low impedance to the reference plane 11 connected to the reference plane voltage terminal VP. Thus, by the voltage generating circuit 23, the reference plane voltage V becomes variable. Incidentally, the reference plane voltage V may take a value above the ground potential, the voltage Vbgr or less.

Figure 5:
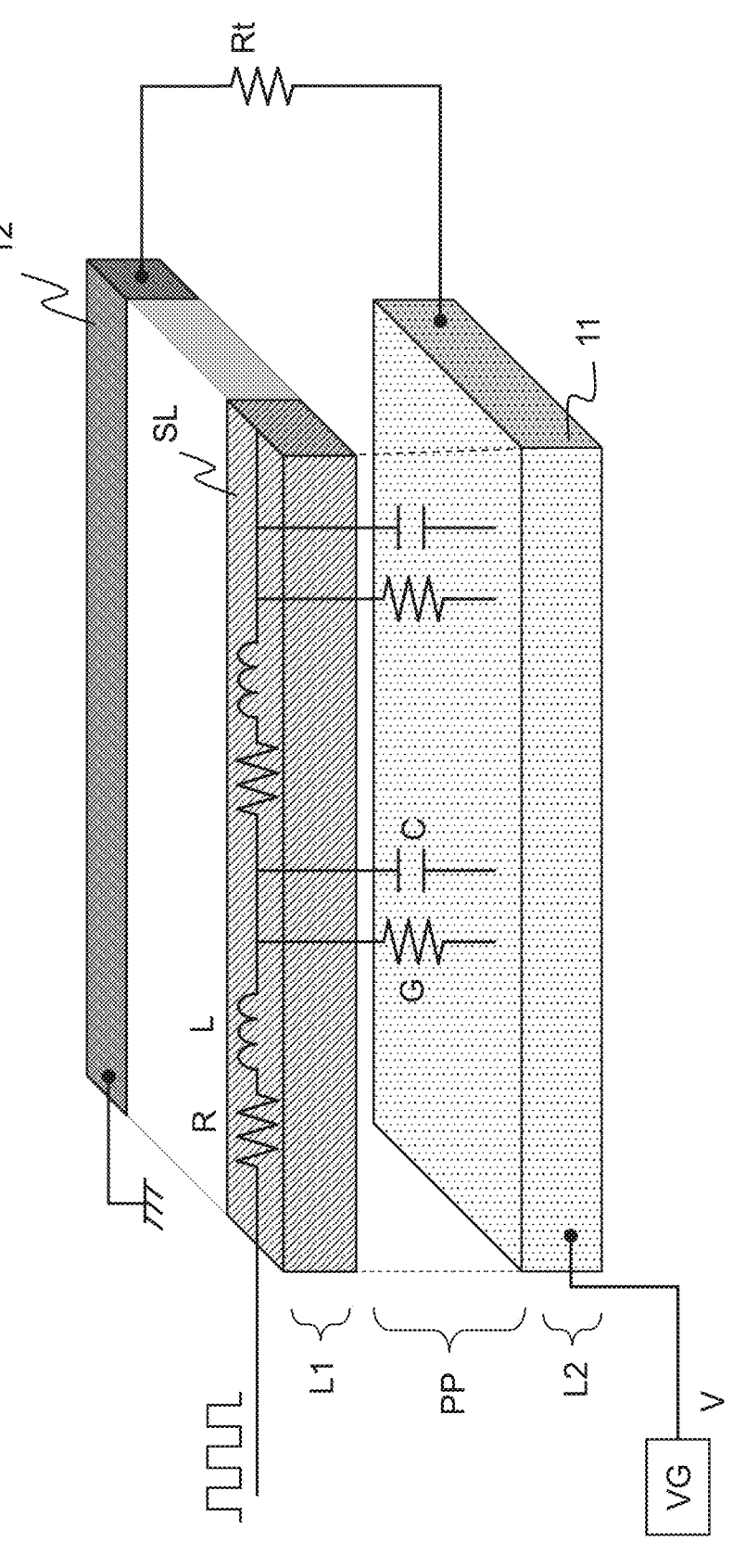
FIG. 5 is a schematic diagram illustrating the signal transmission line according to the first embodiment.

FIG. 5 is a schematic diagram illustrating the signal transmission line SL on the printed circuit board 1. As shown in FIG. 5, the signal wiring pattern of the signal transmission line SL is disposed on the surface layer L1. Further, the wiring pattern of the ground potential line 12 is also disposed on the surface layer L1. The reference plane 11 is disposed in the conductor layer L2 below the surface layer L1. Between the surface layer L1 and the conductor layer L2 prepreg PP is formed.

As shown in FIG. 5, the signal transmission line SL has parasitic inductance L, parasitic capacitance C, conductor loss R and conductance G. When Conductor loss F and conductance G are sufficiently small as compared with L, C, the characteristic impedance Z of the signal transmission line SL can be expressed by $Z=\sqrt{(L/C)}$. In the present embodiment, the value of the parasitic capacitance C between the signal wiring pattern and the reference plane can be changed by varying the potential of the reference plane 11. Thus, it is possible to adjust the characteristic impedance Z of the signal transmission line SL.

The parasitic capacitance C is an element that affects the attenuation of the high-frequency component of the signal for transmitting the signal transmission line SL. Therefore, as described above, by varying the potential of the reference plane 11, the value of the parasitic capacitance C can be adjusted to improve the signal quality.

In the present embodiment, as described above, the signal transmission lines SL1, SL2 constitute a differential signal transmission line. Between the differential signal transmission lines, a current generated by such phase shift (e.g., common mode current) flows. The return path of the signal for transmitting the signal transmission line SL is formed in the reference plane 11 which is supplied with a potential as a reference of the signal for transmitting the signal transmission line SL. On the other hand, the return path of the current due to phase shift or the like is formed in the ground potential line 12 for supplying a reference potential of the circuit (interface circuit 21) for outputting signals to the signal transmission line SL1, SL2. Therefore, in order to suppress the common mode noise, it is necessary to ensure the return path of the current due to phase shift or the like. Therefore, in the present embodiment, the resistor Rt is connected between the reference plane 11 and the ground potential line 12. The resistor Rt is provided on the far end side from the transmission source of the signal for transmitting the signal transmission line in order to ensure the return path. In FIG. 1, the resistor Rt is arranged near the end of the signal transmission lines SL1, SL2 far from the transmission terminals TXp, Txn of the semiconductor device 2. Further, another resistor Rt is arranged near the end of the signal transmission lines SL3, SL4 near the receiving terminal RXp, PXn of the semiconductor device 2. The resistance value of the resistor Rt is calculated based on the differential impedance of the transmission standard. For example, in the case of PCI-e, the resistance of the resistor Rt is 100Ω. Thus, by ensuring the return path of the current due to such phase shift, possible to reduce the common mode noise.

Figure 6:
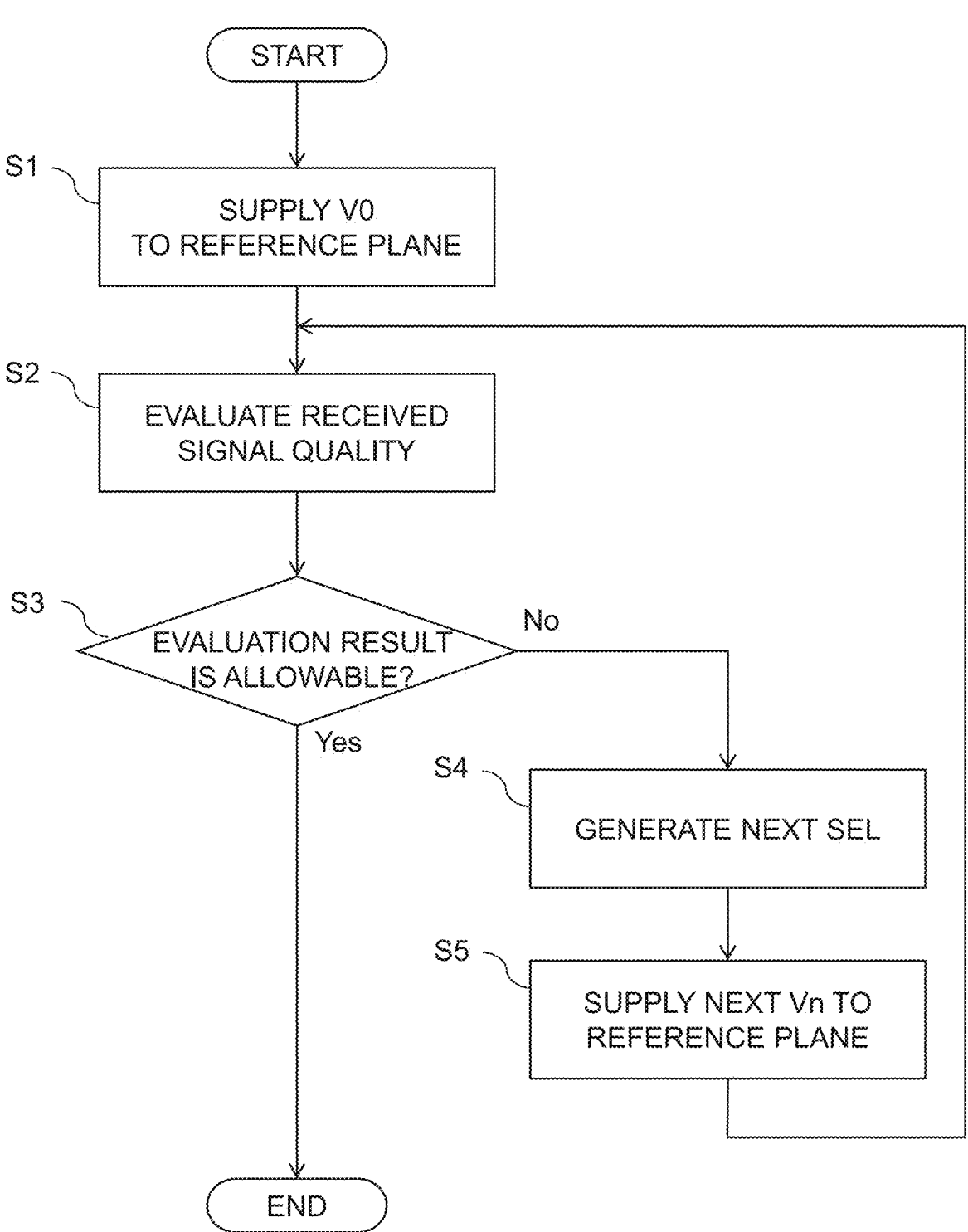
FIG. 6 is a characteristic impedance adjustment flow according to first embodiment.

Next, a characteristic impedance adjustment flow will be described. FIG. 6 is a characteristic impedance adjustment flow by the semiconductor device 2 according to the present embodiment.

First, the semiconductor device 2 mounted on a printed circuit board is set to the characteristic impedance evaluation mode for the signal transmission line via the mode setting terminal (not shown). The processing unit PU outputs a selection control signal SEL as the voltage generating circuit VG selects the initial voltage for evaluation. Thus, the initial voltage V0 for evaluation from the voltage generating circuit VG is output, is applied to the reference plane 11 (step S1).

With the voltage V0 applied to the reference plane 11, the semiconductor device 2 receives a signal for evaluation transmitted via the signal transmission line SL. The signal quality feedback circuit FB in the semiconductor device 2 evaluates the signal quality of the received signal (step S2).

The processing unit PU determines the signal quality evaluation result by the signal quality feedback circuit FB (step S3). For example, if the signal quality feedback circuit FB is a bit error rate counter, the processing unit PU determines whether the measured bit error rate is an acceptable value. For example, if the nit error rate is less than or equal to a predetermined value, it is determined that the characteristic impedance is appropriately set by the reference plane voltage applied and an acceptable signal quality has been obtained, then the evaluation is terminated (Yes in step S3). If the bit error rate exceeds the predetermined value (No in step S3), the process proceeds to step S4.

When the processing unit PU is determined that further adjustment of the characteristic impedance is necessary (No in step S3) based on the evaluation result by the signal quality feedback circuit FB, the selection control signal SEL is updated (step S4). The voltage V1 is output from the voltage generating circuit VG based on the updated selection control signal SEL. The reference plane line 11 is supplied with the voltage V1 via the reference plane voltage terminal VR (step S5). The semiconductor device 2, in a state where the voltage V1 is applied to the reference plane 11, receives the evaluation signal. Then, the process returns to step S2, by the signal quality feedback circuit FB, the signal quality evaluation is executed. By repeating this, it is possible to determine the value of the reference plane voltage V for better signal quality. When the value of the reference plane voltage V is determined, the value of the selection control signal SEL for selecting the reference plane voltage V is held in the storage element (not shown) in the processing unit 22, and terminates the characteristic impedance evaluation mode.

During normal operation of the semiconductor device 2, the value of the selection control signal SEL held in the storage element is read, it is applied to the voltage generating circuit VG. Therefore, when the semiconductor system 100 is operated, it is possible to perform communication between the semiconductor devices 2, 3 with the optimized characteristic impedance of the signal transmission line SL by supplying the appropriate refence plane voltage V to the refence plane 11.

The characteristic impedance adjustment flow may be performed while the evaluation device is connected to the semiconductor device 2 on the evaluation board. In this case, the evaluation signal is transmitted from the evaluation device. Further, the characteristic impedance adjustment flow may be performed during the training period of the semiconductor device 2 and the semiconductor device 3 which are mounted on a printed circuit board before starting the communication. In this case, it is necessary that the evaluation signal from the semiconductor device 3 is transmitted.

Generally, the characteristic impedance of the signal transmission line is calculated based on the width, the wiring spacing of the transmission line, the thickness of the insulating layer (prepreg) and the relative dielectric constant. However, the characteristic impedance after manufacturing does not always agree with the calculated value. Therefore, for example, the receiving circuit of PCI-e includes a waveform compensating circuit such as a continuous time linear equalizer (CTLE) and the decision feedback equalizer (DFE). By using such a waveform compensation circuit, adjustment and noise filtering of the transmission signal is performed. If improvement of signal quality by such a waveform compensation circuits is not sufficient or if further improvement is required, implementation of the characteristic impedance adjustment flow described above is useful. That is, according to the present embodiment, by generating a reference plane voltage based on the signal quality evaluation result, it is possible to adjust the characteristic impedance of the signal transmission line SL. Therefore, even when the signal quality improvement by the waveform compensation circuit is insufficient, according to the present embodiment, the signal quality can be improved. Further, by applying a predetermined voltage to the reference plane 11, it is possible to reduce the parasitic capacitance component of the signal transmission line SL. Therefore, at the time of printed circuit board design, it is possible to design the wiring width of the signal transmission line thicker. As a result, the return loss and the insertion loss can be improved, and the manufacturing difficulty can be reduced. In addition, there is no need to use high-quality substrate materials for signal quality improvement, and efficiency in the placement design of signal transmission lines on printed circuit boards can be improved. Therefore, according to the present embodiment, a cost reduction effect related to the design of the semiconductor system can be expected.

First Modified Example of First Embodiment

Figure 7:
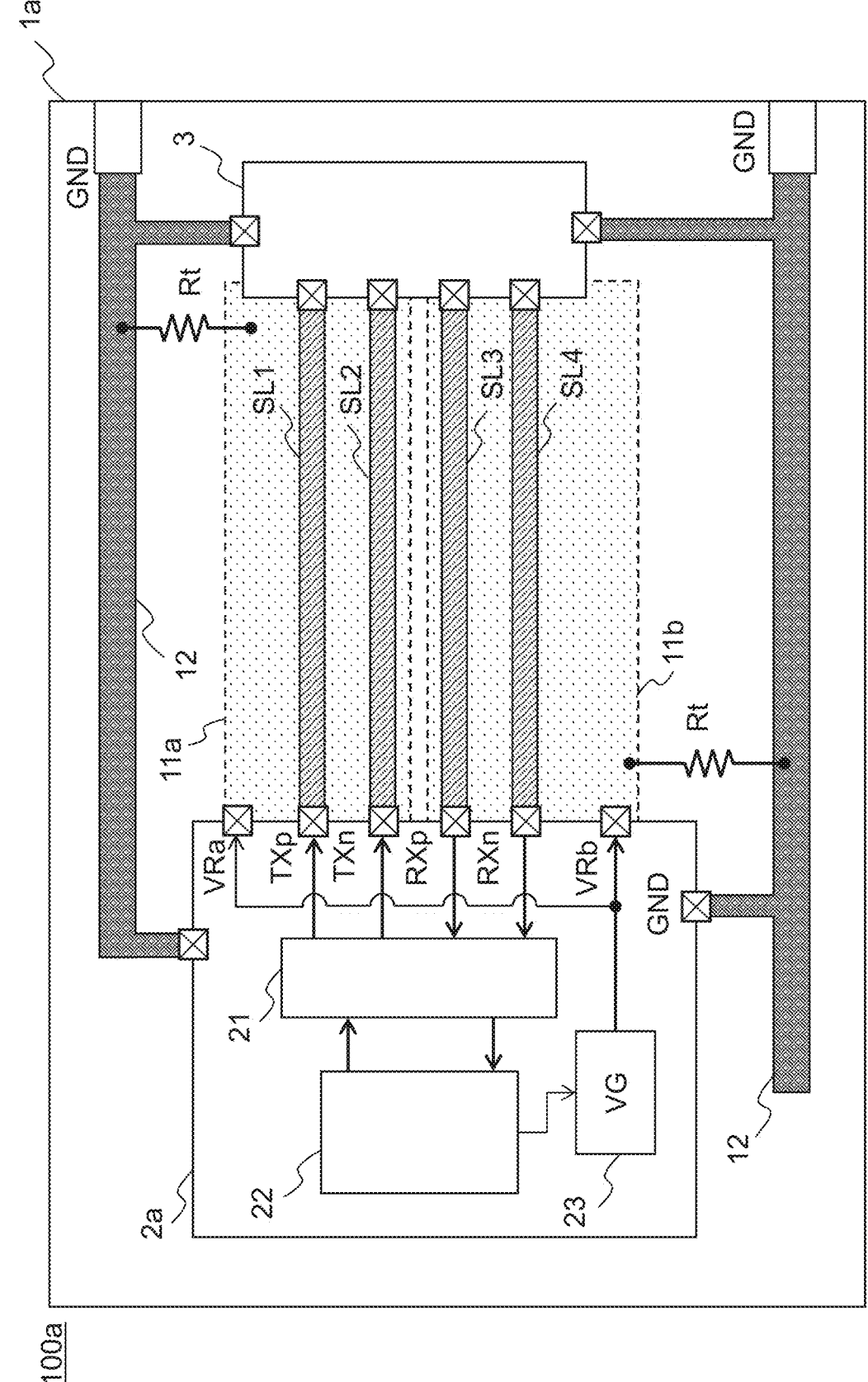
FIG. 7 is a block diagram showing a configuration of a semiconductor device according to the first modified example of the first embodiment.

Next, first modified example of first embodiment will be described. In the first embodiment described above, one reference plane 11 is provided for the differential signal transmission line pair (signal transmission line SL1, SL2) transmitting a differential signal output from the semiconductor device 2 and the differential signal transmission line pair (signal transmission line SL3, SL4) transmitting a differential signal received by the semiconductor device 2. However, the reference plane may be divided for each differential signal transmission line pair. FIG. 7 is a block diagram showing a configuration example of a semiconductor system 100a according to first modified example of the first embodiment. In this modified example, the components other than the semiconductor device 2a and the reference planes 11a, 11b in the semiconductor system 100a may be the same as those shown in FIG. 1. Therefore, the components having the same functions as those in FIG. 1 are denoted by the same reference numerals, and descriptions thereof are omitted.

As shown in FIG. 7, the semiconductor system 100a includes a reference plane 11a for a differential signal transmission line pair having signal transmission lines SL1, SL2 and a reference plane 11b for a differential signal transmission line pair having signal transmission lines SL3, SL4. The reference plane 11a is disposed to be overlapped with an area where the differential signal transmission line pair having signal transmission lines SL1, SL2 is formed in plan view. The reference plane 11b is disposed to be overlapped with an area where the differential signal transmission line pair having signal transmission lines SL3, SL4 is formed in plan view.

The semiconductor device 2a has a plurality of reference plane voltage terminals VRa, VRb respectively connected to the reference planes 11a, 11b. The reference plane voltage terminals VRa, VRb are connected to the voltage generating circuit 23. The reference planes 11a, 11b are supplied with the reference plane voltage V through the reference plane voltage terminals VRa, VRb.

Thus, by providing a reference plane for each differential signal transmission line pairs, in addition to substantially the same effect as in the first embodiment, the effect that the wiring ease in the printed circuit board design is improved is obtained. In addition, a return path can be secured, and more stable signal transmission becomes possible.

When the semiconductor device 2 has a plurality of interface circuits of different transmission standards, a reference planes are preferably provided for each signal transmission line group connected to each interface circuit. In this case, a plurality of voltage generating circuit VG may be provided so that different reference plane voltages can be supplied to each reference planes.

Second Modified Example of First Embodiment

Figure 8:
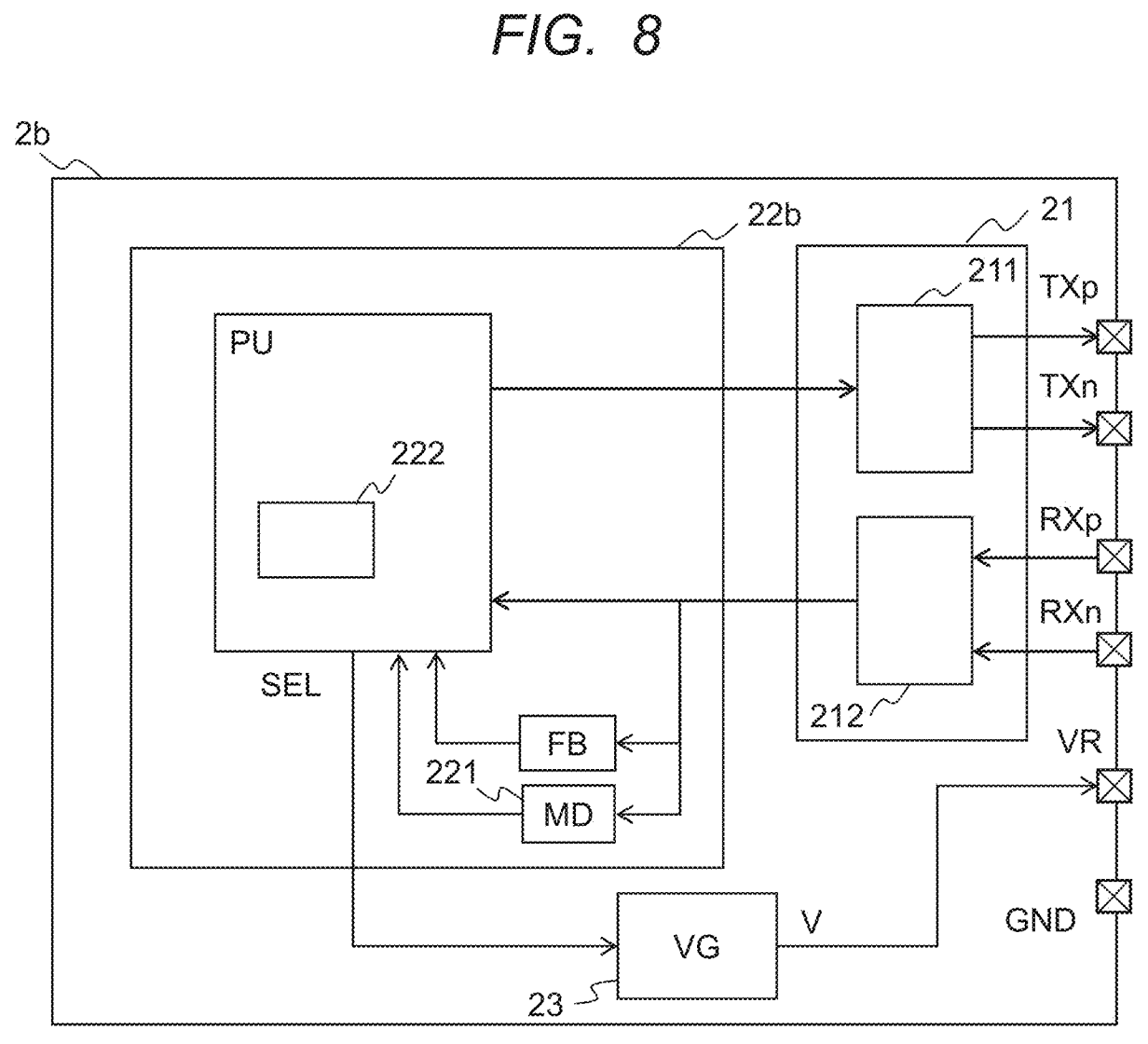

Next, second modified example of the first embodiment will be described. FIG. 8 is a configuration diagram of a semiconductor device 2b according to the second modified example of the first embodiment. The signal processing unit 22b further includes a mode identification circuit 221 and a storage unit 222.

The mode identification circuit 221 identifies the communication mode with the connection destination device and generates a mode identification signal based on the received signal from the outside of the semiconductor device 2b.

The storage unit 222 stores, for each communication mode, the selection control data for selecting the reference plane voltage obtained as a result of performing the adjustment of the characteristic impedance described in the first embodiment. The processing unit PU reads the corresponding selection control data from the storage unit 222 based on the mode identification signal from the mode identification circuit 221. The read selection control data is supplied to the voltage generating circuit 23 as a selection control signal SEL.

Therefore, when the semiconductor device 2 identifies the communication mode with the connection destination device, it is possible to supply a reference plane voltage suitable for the identified communication mode to the reference plane. That is, depending on the communication mode, it is possible to adjust the characteristic impedance of the signal transmission line, it is possible to prevent deterioration of the signal waveform.

For example, a description will be given of a case in which the semiconductor device 2a includes a USB controller corresponding to a Universal Serial Bus) Type-C. USB Type-C has an alternate mode. In the alternate mode, specific signal transmission lines are used for signal transmission of a plurality of communication standards. Therefore, the characteristic impedance of the signal transmission line may differ depending on the communication standard of the device connected in the alternate mode. However, according to the second modified example of the first embodiment, by changing the reference plane voltage according to the communication standard (communication mode), it is possible to adjust the characteristic impedance of the signal transmission line. Therefore, according to the semiconductor device 2a, it is possible to suppress the disturbance of the signal waveform even during signal transmission of various communication standards.

The semiconductor device 2a having PCI-e interface will be described. PC-e standard has different communication speeds for different generations. PCI-e has interchangeability between generations so that it can communicate between devices of different generations. When communication is performed between devices of different generations, the communication rate of signals is matched to a device having a lower generation. In this instance, due to the difference in the communication speed, the floating charge of the wiring of the signal transmission line is changed, the characteristic impedance is changed. However, according to this modified example, the semiconductor device 2a can provide an appropriate reference plane voltage V to the reference plane of the signal transmission line to adjust the characteristic impedance of the signal transmission line. Therefore, even if the device of the connection destination of the semiconductor device 2a has a PCI-e of any generation, it is possible to adjust the characteristic impedance appropriately according to the communication speed and to prevent degradation of the signal waveform. Incidentally, when the semiconductor device 2a has a PCI-e interface, the characteristic impedance adjusting flow shown in FIG. 5 may be performed in the training sequence performed when connected to the connection destination device.

Second Embodiment

Figure 9A:
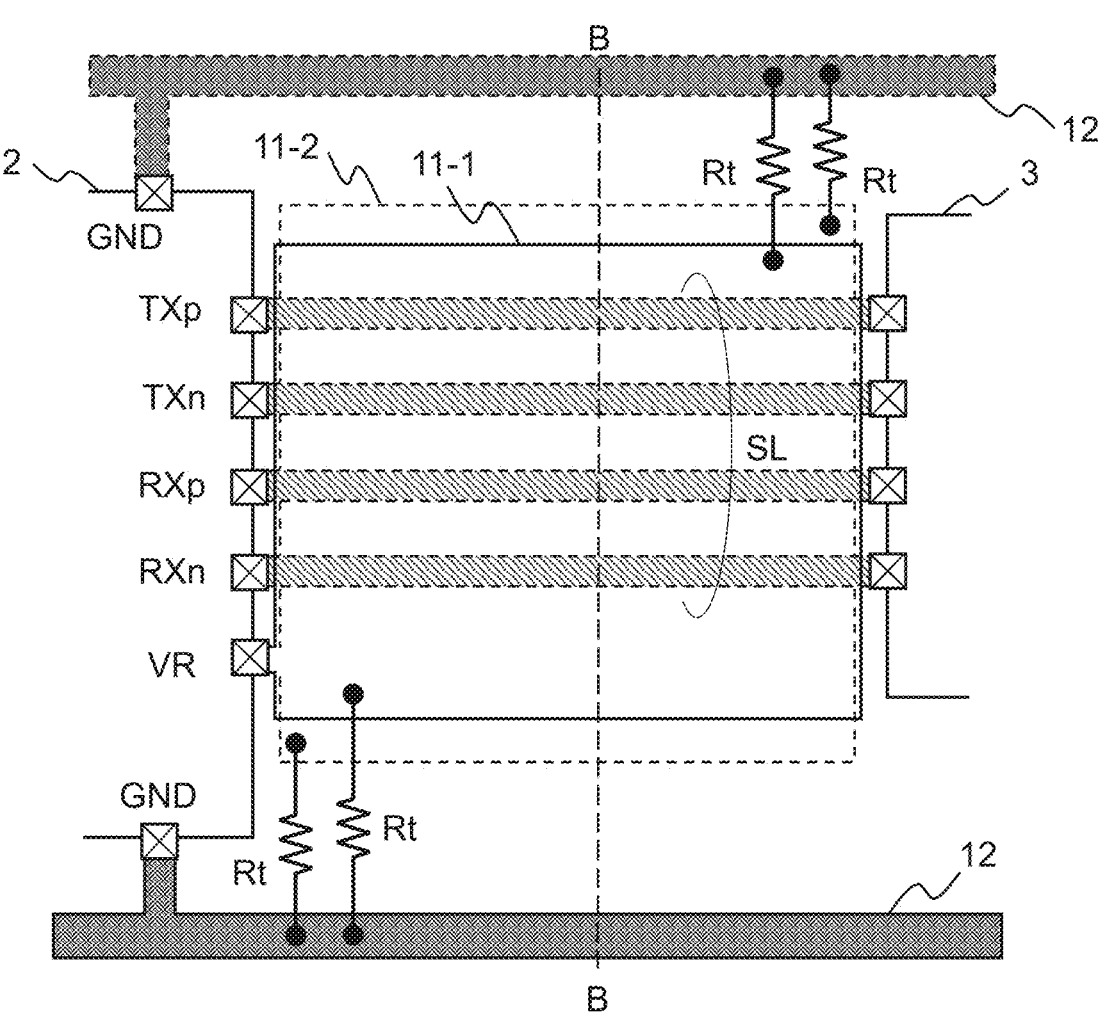
FIG. 9A is a plan view showing an exemplary configuration of the signal transmission line according to the second embodiment.
Figure 9B:
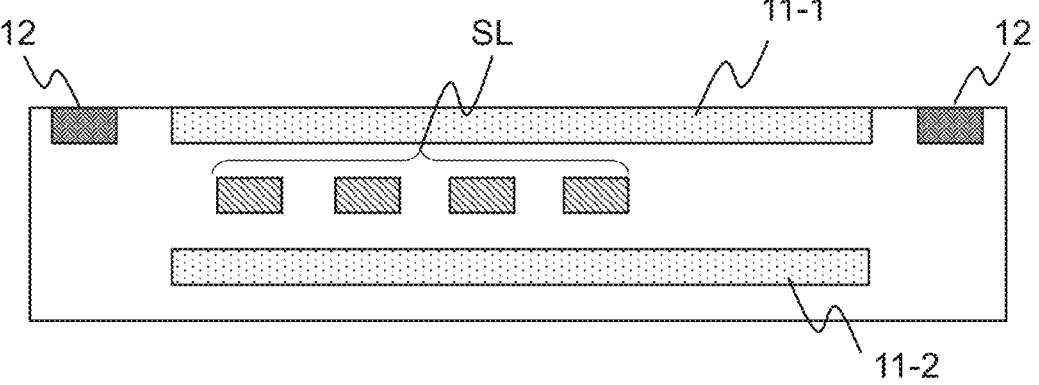
FIG. 9B is a schematic cross-sectional view taken along line B-B of FIG. 9A.

Next, second embodiment will be described. FIG. 9A is a plan view showing a configuration example of a signal transmission line SL according to the second embodiment. FIG. 9B is a cross-sectional view taken along line B-B of FIG. 9A. In the second embodiment, components other than the signal transmission line SL and the reference plane may be the same as those shown in FIG. 1. Therefore, components having the same functions as those in FIG. 1 are denoted by the same reference numerals, and repetitive descriptions thereof are omitted.

As shown in FIGS. 9A and 9B, the signal transmission line SL has a strip line configuration. A signal transmission line having the general strip line structure is sandwiched between two ground planes in the printed circuit board. However, in the present embodiment, the signal transmission line SL is sandwiched between the two reference planes 11-1, 11-2. The reference planes 11-1, 11-2 are impedance forming surfaces for the transmission signal of the signal transmission line SL.

The reference plane 11-1 is formed on the surface layer of the printed circuit board 1 and is provided overlapping an area where the signal transmission line SL is disposed in a plan view. The reference plane 11-2 is formed in the lower layer than the conductor layer in which the signal transmission line SL is provided. The reference plane 11-2 is formed overlapping with the area where the signal transmission line SL is disposed in a plan view similarly to the reference plane 11-1. Further, the reference planes 11-1, 11-2 are supplied with the reference plane voltage V from the semiconductor device 2. As in the first embodiment, the reference planes 11-1 and 11-2 are connected to the ground potential line 12 via a resistor Rt, respectively. The return path can be secured by the resistor Rt, it is possible to suppress the common mode noise.

Further, the reference planes 11-1, 11-2 are supplied with the reference plane voltage V from the reference plane voltage terminal VR of the semiconductor device 2. The reference plane voltage V is set variably based on the signal quality for transmitting the signal transmission line SL, so that it is possible to adjust the characteristic impedance. Thus, even a signal transmission line of the strip line structure, it is possible to adjust the characteristic impedance by varying the voltage supplied to the reference planes sandwiching the signal transmission line.

Modified Example of Second Embodiment

Figure 10A:
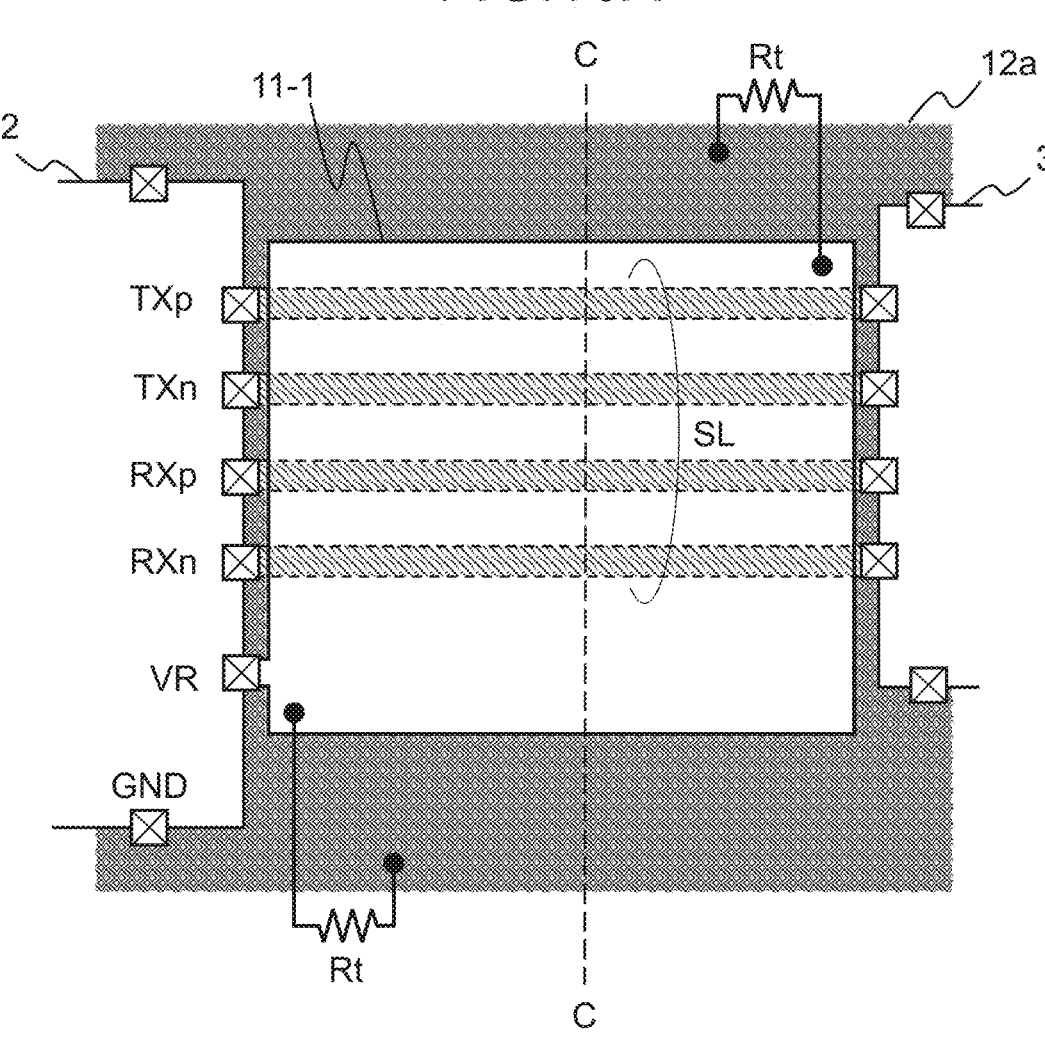
FIG. 10A is a plan view showing a configuration example of a signal transmission line SL according to a modification of the second embodiment.
Figure 10B:
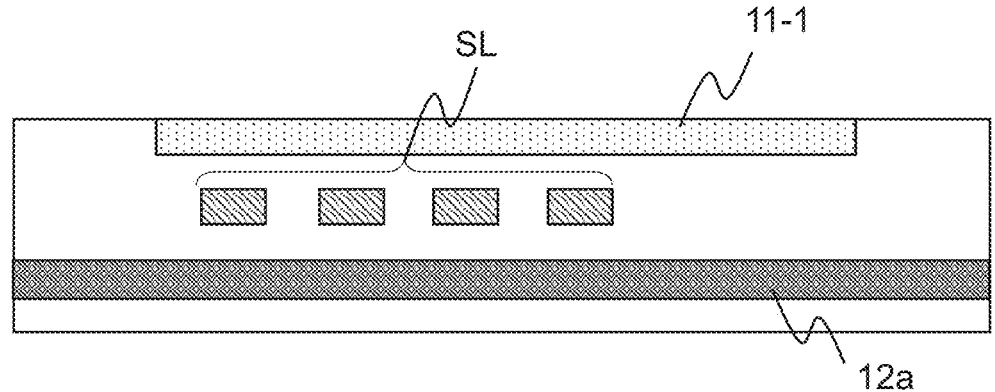
FIG. 10B is a schematic diagram of a C-C cross section of FIG. 10A.

FIG. 10A is a plan view showing a configuration example of a signal transmission line SL according to a modified example of the second embodiment. FIG. 10B is a cross-sectional view taken along line C-C of FIG. 10A. The present modified example differ from the second embodiment in that one of the reference planes sandwiching the signal transmission line SL having the strip line structure a ground plane 12a. That is, in the present modified example, the signal transmission line SL is sandwiched between the reference plane 11 and the ground plane 12a.

The ground plane 12a is formed in the lower layer than the conductor layer in which the signal transmission line SL is provided, and is supplied with the ground potential. Furthermore, the ground plane 12a is provided overlapping with at least the area where the signal transmission line SL is disposed in a plan view. Further, the reference plane 11-1 and the ground plane 12a are each connected via a resistor Rt in the vicinity of the reception side end of the signal transmission line SL. This is to suppress the common mode noise as described above.

The reference plane 11-1 is supplied with the reference plane voltage V from the semiconductor device 2 similarly to the first and second embodiments. Even a signal transmission line of the strip line structure as in the present modified example, by supplying a reference plane voltage to one of the surfaces serving as a reference plane of the signal transmission line, it is possible to adjust the characteristic impedance.

In the first and second embodiments have been described characteristic impedance adjustment of the signal transmission lines for transmitting signals between the devices disposed on the printed circuit board. However, the characteristic impedance adjustment method is also applicable to signal transmission lines on the semiconductor package. For example, in SIP (System in Package) having a plurality of semiconductor chips in one package, the signal transmission line SL is disposed on the package substrate. The characteristic impedance adjustment method may be applied to the signal transmission line for transmitting signals on the package substrate.

Further, in the first and second embodiments, an example in which both the transmitting signal transmission lines pair having the signal transmission lines SL1, SL2 and the receiving signal transmission lines pair having the signal transmission lines SL3, SL4 are arranged in the same conductive layer, but is not limited thereto. That is, the transmitting signal transmission line pair having the signal transmission lines SL2 and the receiving signal transmission line pair having the signal transmission lines SL3, SL4 may be arranged in different conductor layers. In this case, the characteristic impedance can be adjusted by providing reference planes corresponding to each signal transmission line pairs and supplying an appropriate reference plane voltage to the reference planes.

Further, in the first and second embodiments, a ground plane which is formed on different conductive layer from the signal transmission line and the reference plane and overlapped with the reference plane in plan view may be used instead of the ground potential line 12.

Further, in the first and second embodiments, the signal transmission line SL has been described as transmitting a differential signal is not limited thereto. Transmission system between the devices, in addition to the differential transmission system, for example, there are various systems such as a single-ended transmission system. Therefore, the signal transmission line SL may be one that performs signal transmission based on these various transmission systems.

Further, in the first and second embodiments, the connection destination of the semiconductor device 2 has been described as a semiconductor device 3 is not limited to a semiconductor device as long as it is a component for transmitting and receiving a semiconductor device 2 and a signal. For example, it may be a connector for connecting to an external device.

Furthermore, in the first and second embodiments, a band gap reference circuit has been described as example of the voltage generating circuit 23 is not limited thereto, and the circuit can be modified in various ways as long as it is a circuit that generates a reference voltage.

Although the invention made by the present inventor has been specifically described based on the embodiment, the present invention is not limited to the embodiment described above, and it is needless to say that various modifications can be made without departing from the gist thereof.

What is claimed is:
1. A semiconductor device comprising:
a receiving terminal for receiving a signal transmitted through a signal transmission line;
a reference plane voltage terminal connected to a reference plane as a reference for the signal on the signal transmission line;
a voltage generating circuit configured to generate a reference plane voltage to be supplied to the reference plane voltage terminal based on the signal received by the receiving terminal; and
a signal quality feedback circuit configured to perform signal quality evaluation of a second signal,
wherein the voltage generating circuit is configured to generate the reference plane voltage based on evaluation result by the signal quality feedback circuit, and
wherein the signal quality feedback circuit comprises a bit error rate counter.
2. The semiconductor device according to claim 1, further comprising:
a mode identification circuit configured to identify a communication mode with a connection destination device based on the signal received by the receiving terminal,

wherein the voltage generating circuit is configured to generate the reference plane voltage based on an identified communication mode by the mode identification circuit.
3. The semiconductor device according to claim 1, wherein the reference plane voltage is variable voltage.
4. The semiconductor device according to claim 1, wherein the receiving terminal comprises a receiving terminal pair for receiving a second differential signal.
5. The semiconductor device according to claim 1, wherein the voltage generating circuit comprises:
a reference voltage source;
a resistor divider circuit configured to divide an output voltage of the reference voltage source; and
a selection circuit configured to select one of a plurality of voltages generated by the resistor divider circuit based on the evaluation result and to output the selected voltage as the reference plane voltage.
6. The semiconductor device according to claim 2, wherein the voltage generating circuit comprises:
a reference voltage source;
a resistor divider circuit configured to divide an output voltage of the reference voltage source; and
a selection circuit configured to select one of a plurality of voltages generated by the resistor divider circuit based on the identified communication mode.
7. A semiconductor system comprising:
the semiconductor device according to claim 1; and
a printed circuit board on which the semiconductor device is mounted,
wherein the printed circuit board includes:
a first conductor layer having the signal transmission line; and
a second conductor layer having the reference plane.
8. The semiconductor system according to claim 7,
wherein the first conductor layer is a surface layer of the printed circuit board, and
wherein the second conductor layer is formed under the surface layer.
9. The semiconductor system according to claim 7,
wherein the reference plane is a first reference plane,
wherein the printed circuit board further includes a second reference plane formed in a third conductor layer,
wherein the first conductor layer is formed between the second and the third conductor layer, and
wherein the first and the second reference plane are supplied with the reference plane voltage.
10. The semiconductor system according to claim 7,
wherein the signal transmission line is a first signal transmission line,
wherein the semiconductor system further comprises a second signal transmission line connected to a transmission terminal of the semiconductor device, and
wherein the reference plane is arranged to be overlapped with the first and the second signal transmission line in plan view.
11. The semiconductor system according to claim 7,
wherein the signal transmission line is a first signal transmission line,
wherein the reference plane is a first reference plane arranged to be overlapped with the first signal transmission line in plan view, and
wherein the semiconductor system further comprises a second signal transmission line connected to a transmission terminal of the semiconductor device, and a second reference plane arranged to be overlapped with the second signal transmission line in plan view.

12. A semiconductor device mounted on a printed circuit board, comprising:

a pair of receiving terminals receiving differential signals that are transmitted through a differential signal transmission line pair;

a reference plane voltage terminal coupled to a reference plane;

a ground terminal coupled to a ground potential line, and a voltage generating circuit configured to generate a reference plane voltage to be supplied to the reference plane voltage terminal based on the differential signals that have been received through the pair of receiving terminals, wherein the printed circuit board includes:

a first conductor layer having the differential signal transmission line pair;

a second conductor layer having the reference plane; and a resistor coupled between the reference plane and the ground potential line near the pair of receiving terminals.

13. The semiconductor device according to claim 12, wherein the resistor has a value determined based on a differential impedance of transmission standard.

14. The semiconductor device according to claim 12, wherein the first conductor layer is different from the second conductor layer, and wherein the reference plane is formed to be overlapped with the differential signal transmission line pair in plan view.

15. The semiconductor device according to claim 12, wherein a third conductor layer is same as the first conductor layer.

16. The semiconductor device according to claim 12, wherein a third conductor layer is different from the first and the second conductor layer.

17. The semiconductor device according to claim 12, wherein the voltage generating circuit includes a bit error rate counter that counts a bit error of the differential signals, and wherein the voltage generating circuit generates a refence voltage based on a bit error rate from the bit error rate counter.

* * * * *